United States Patent [19]

Stade

[11] Patent Number: 5,229,721

[45] Date of Patent: Jul. 20, 1993

[54] MICROPOWER AMPLIFIER/TRANSDUCER DRIVER WITH SIGNAL EXPANSION

[75] Inventor: Wayne R. Stade, Aptos, Calif.

[73] Assignee: Plantronics, Inc., Santa Cruz, Calif.

[21] Appl. No.: 863,009

[22] Filed: Apr. 6, 1992

[51] Int. Cl.⁵ .................................................. H03F 3/30
[52] U.S. Cl. .................................... 330/265; 330/268; 330/270
[58] Field of Search ............... 330/263, 265, 267, 268, 330/270, 271, 273, 274; 379/395

[56] References Cited

U.S. PATENT DOCUMENTS

| | | | |
|---|---|---|---|
| 3,440,538 | 4/1969 | Riley | 330/263 X |
| 3,501,712 | 3/1970 | Webb | 330/267 |
| 3,537,023 | 10/1970 | Myer | 330/265 |
| 3,983,502 | 9/1976 | Wheatley, Jr. | 307/14 |
| 4,072,908 | 2/1978 | Murari et al. | 330/265 |
| 4,152,663 | 5/1979 | Van de Sande | 330/253 |
| 4,163,908 | 8/1979 | Price | 307/296 |
| 4,180,781 | 12/1979 | Kaplan | 330/273 |
| 4,219,781 | 8/1980 | Naokawa | 330/254 |
| 4,238,737 | 12/1980 | Yokoyama | 330/255 |
| 4,267,519 | 5/1981 | Schade, Jr. | 330/255 |
| 4,283,683 | 8/1981 | Main | 330/262 |
| 4,290,026 | 9/1981 | Shoji | 330/255 |
| 4,333,058 | 6/1982 | Hoover | 330/253 |
| 4,409,561 | 10/1983 | Shacter | 330/300 |
| 4,458,213 | 7/1984 | Quan | 330/265 X |
| 4,476,441 | 10/1984 | Gulczynski | 330/273 |
| 4,649,235 | 3/1987 | Sijbers | 330/265 X |
| 4,656,435 | 4/1987 | Czarniak et al. | 330/253 |
| 4,661,781 | 4/1987 | Van Tuijl | 330/255 |
| 4,723,111 | 2/1988 | Verhoeven et al. | 330/255 |
| 4,730,168 | 3/1988 | Senderowicz et al. | 330/253 |
| 4,737,732 | 4/1988 | Westwick | 330/261 |
| 4,837,523 | 6/1989 | Wright | 330/255 |
| 4,853,645 | 8/1989 | Seevinck et al. | 330/255 |
| 4,857,861 | 8/1989 | Seevinck et al. | 330/255 |
| 4,897,612 | 1/1990 | Carroll | 330/253 |
| 4,933,645 | 6/1990 | Kasai | 330/255 |
| 4,963,837 | 10/1990 | Dedic | 330/264 |
| 4,975,949 | 12/1990 | Wimsatt et al. | 379/395 X |
| 5,014,017 | 5/1991 | Ishiguro et al. | 379/395 X |
| 5,015,966 | 5/1991 | McIntyre | 330/253 |
| 5,055,797 | 10/1991 | Chater | 330/268 |

FOREIGN PATENT DOCUMENTS 63955 6/1978 Japan .................................. 330/265

Primary Examiner—James B. Mullins
Attorney, Agent, or Firm—Arnold, White & Durkee

[57] ABSTRACT

An amplifier which combines the low quiescent current requirements of a Class B transistor amplifier with the minimal distortion qualities of a Class AB amplifier. In one disclosed embodiment the amplifier is utilized as a receiver amplifier and as a transmitter in a modular telephone adapter for coupling a telephone headset to a conventional modular telephone comprising a handset and a base unit. Signal expansion circuitry takes advantage of the dynamic emitter resistance of transistors in the amplifier's output stage through modulation of collector current in the output transistors and inverted phase summation of the resulting error signal with the input signal. DC bias circuitry supplies a current supply which is relatively insensitive to changes in power supply or device parameters. In one disclosed embodiment of the invention, two such amplifiers are utilized in a modular telephone headset adapter which allows a telephone headset and a telephone handset to be switchably connected to a telephone base unit.

5 Claims, 7 Drawing Sheets

MICROPOWER AMPLIFIER/TRANSDUCER DRIVER WITH SIGNAL EXPANSION

FIELD OF THE INVENTION

This invention relates generally to the field of electrical circuits, and more particularly to transistor amplifiers.

BACKGROUND OF THE INVENTION

In various fields, including telecommunications and telephony, there is need for amplifiers and/or transducer drivers with minimal current requirements that can deliver low distortion signals into relatively low impedance loads. This need is also present in other industries such as those involved with hearing-aids.

Transistor amplifiers may be classified according to the operating point of their active transistors. For a sinusoidal input, the active element in a so-called "Class A" amplifier conducts for the entire input cycle. In "Class B" amplifiers, the transistor is biased at cutoff, conducting for only half of each input cycle. "Class AB" amplifiers are in between Class A and Class B amplifiers, with collector current in the active transistor flowing for less than a full input cycle, but more than a half cycle. With Class AB operation, one transistor amplifies the positive part of an input signal, and another transistor amplifies the negative part of the input signal. A transistor in "Class C" operation is biased well into its cutoff region, a technique used mainly in radio-frequency tuned amplifiers.

A known problem with Class B amplifiers is crossover distortion, a phenomenon which arises from the curvature of a transistor's input characteristic at very low current levels. Due to this curvature, a transistor operating in Class B and biased at cutoff (i.e. with zero collector current) will tend to distort low-level signals. In practice, crossover distortion in a Class B amplifier manifests itself as kinks in the amplifier's output characteristics in the crossover region where one of the Class B transistors is turning on and the other Class B transistor is turning off.

One way of reducing problems with crossover distortion is to bias each stage of the Class B amplifier above cutoff, outside of the curved region of each transistor's input characteristic. This technique, however, increases the current consumption of the amplifier, since a DC current is present even when the input signal is zero. This technique essentially results in Class AB operation, even though such amplifiers may still be referred to as Class B.

SUMMARY OF THE INVENTION

The present invention relates to a micropower transducer driver without the crossover distortion which is characteristic of prior micropower designs. In accordance with the present invention, an amplifier is provided which exhibits both the low distortion characteristics of Class AB amplifiers and the low power consumption qualities of Class B amplifiers. In addition, signal expansion is an inherent property of the circuit which can be applied for purposes of noise reduction during no-signal or low-signal conditions.

In accordance with the present invention, a dynamic-bias output stage is employed where only the current necessary for the load is drawn from the power supply the instant it is needed. After the peak current is supplied to the load the circuit immediately returns to its "idle" state. This is essentially Class-B operation and differs from conventional Class-AB operation where a significant amount of current must flow in the output stage at all times to provide an output signal that is free of crossover distortion. As noted above, Class-B systems typically suffer from this form of distortion, so a modified Class-B topology is needed to eliminate this inherent problem. The system in accordance with the present invention is free of crossover distortion yet has essentially no quiescent current requirements. It is capable of supplying a $-10$ dBV signal into 150 Ohms with a supply voltage (hereinafter designated as "$V_{cc}$") of about 2.0 Volts. By definition, it only draws current from the power supply when it is providing power to the load, and the current needed is a function of the load impedance and signal level. Several mechanisms are necessary for the effectiveness of the output stage to be realized. One is the copious use of negative feedback, possible with the inherent high open loop gain of the driver stage. Feedback alone is not enough to guarantee zero crossover distortion with low impedance loads, however. It has been demonstrated by the inventor that by biasing the output stage transistors at the brink of conduction, and designing the biasing scheme so that the bias can follow the needs of the output signal and load conditions, a zero-crossover output can be attained.

BRIEF DESCRIPTION OF THE DRAWINGS

The aforementioned and other features of the present invention will be best appreciated with reference to the detailed description of a particular embodiment of the invention, when read in conjunction with the accompanying drawings, wherein.

DETAILED DESCRIPTION OF A SPECIFIC EMBODIMENT OF THE INVENTION

Figure 1:
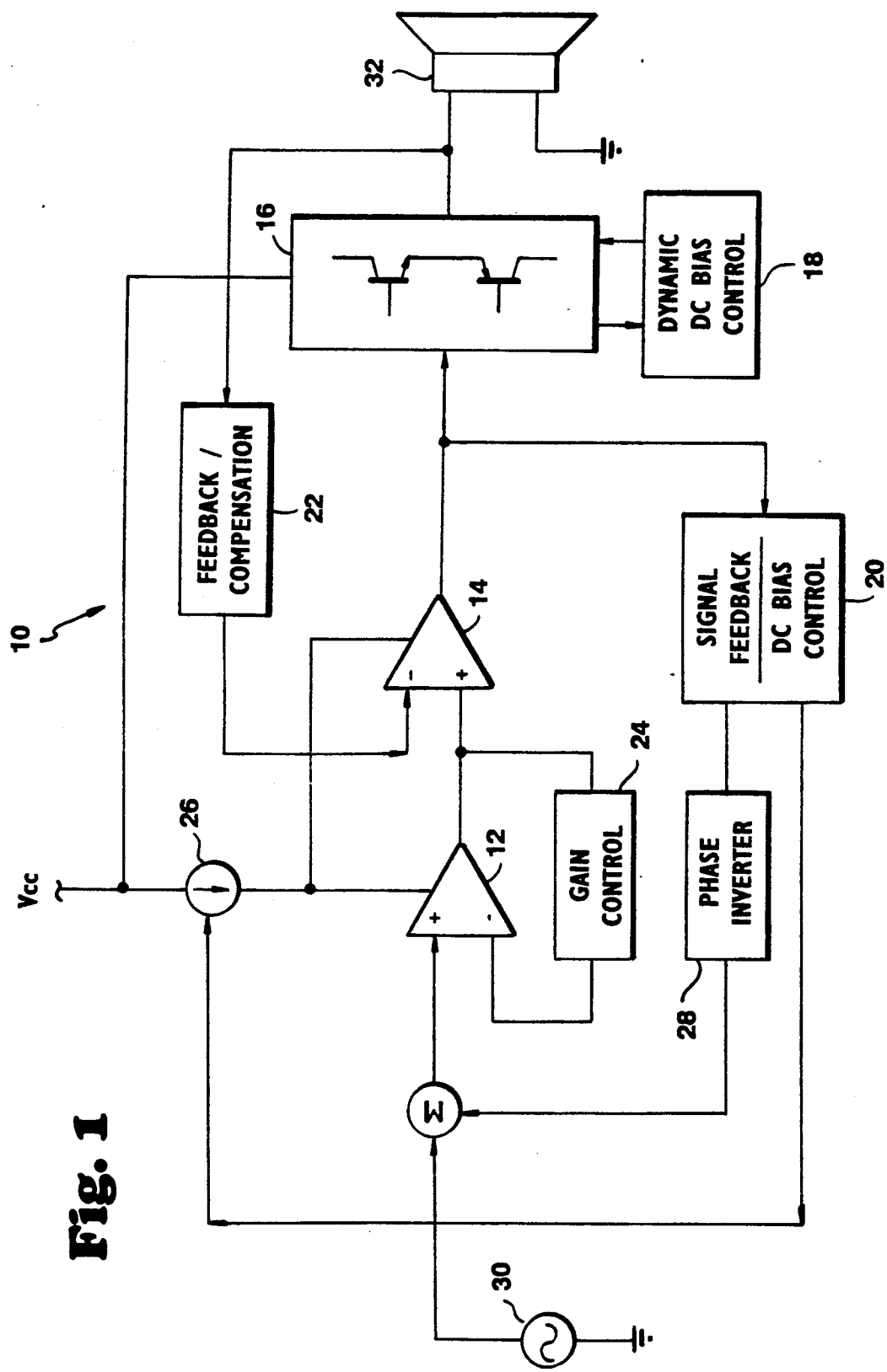
FIG. 1 is a diagram in block form showing an amplifier/driver system in accordance with one embodiment of the present invention.

FIG. 1 shows the interconnections of the system subsections of an amplifier system 10 in accordance with one embodiment of the present invention. As shown in FIG. 1, the amplifier system consists of a low-level gain stage 12, a secondary driver stage 14, a final output stage 16 with associated self-biasing circuitry 18, and DC bias control and feedback circuitry 20. Signal expansion properties are brought about by the interaction of driver stage 14 and output stage 16 along with signal feedback via bias control circuitry 20 and phase inversion circuitry 28. System 10 of FIG. 1 further includes feedback compensation circuitry 22 disposed between the output of output stage 16 and the input of driver stage 14; gain control circuitry 24 disposed between the output and input of low-level gain stage 12; and a current source 26 supplying power to low-level gain stage 12 and driver stage 14.

In FIG. 1, an input signal source is designated as 30, and an output load impedance is designated as 32.

Figure 2:
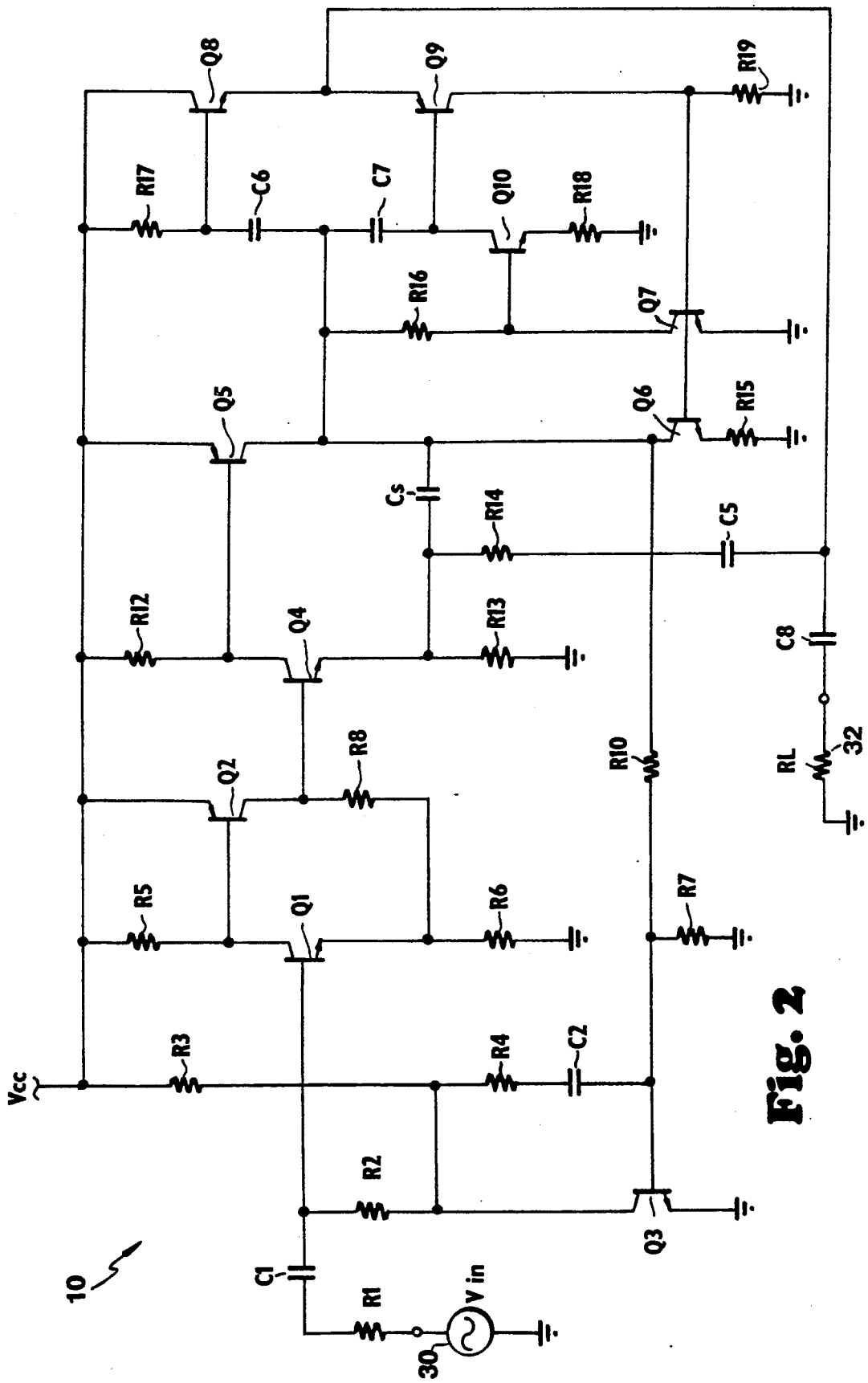
FIG. 2 is a schematic diagram of the system of FIG. 1.

Turning now to the schematic diagram of FIG. 2, it can be seen that resistor R1 and capacitor C1 couple the input signal from signal generator 30 to the base of transistor Q1. This transistor along with transistor Q2 and the associated resistors make up low-level gain stage 12. Resistors R8 and R6 set up the closed loop gain and along with R5, establish the operating current of this stage. The signal from the collector of Q2 is coupled to the base of transistor Q4. Q4 along with transistor Q5 form another series feedback pair. Whereas R8 closes the loop in low-level gain stage 12, the output from output stage 16 is used as the feedback element of driver stage 14. Series capacitor C5 isolates the DC bias conditions of output stage 16 from the DC conditions of the rest of the system. Resistor R14 sets the closed loop gain of driver stage 14. Capacitor Cs is provided as frequency/phase compensation to assure stability with reactive loads.

The collector of Q5, which drives output stage 16, also serves as the monitoring point for the DC bias control of low-level gain stage 12 and driver stage 14. This DC bias control is accomplished as follows: Q5 collector current flows into a voltage divider comprising resistors R10 and R7, causing the voltage on the base of Q3 to increase, whereby Q3 will start to turn on, reducing the base drive for Q1. This reduced drive is telegraphed through Q2, Q4, and Q5 until a point of equilibrium is reached where the scaled collector voltage of Q5 results in Q3 turning on.

As shown in FIG. 1, output stage 16 is driven by driver stage 14, and is a dynamic-bias minimal-quiescent-current design. Referring again to FIG. 2, quiescent base drive for output transistors Q8 and Q9 is provided via R17. Current flows into the base of Q8, through the emitter of both transistors Q8 and Q9, then out of the base of Q9. Current then flows through bias-control transistor Q10 and R18. Resistor R16 provides base drive for Q10. The resulting collector currents of Q8 and Q9 then flow into R19. Q7 will start to turn on when the voltage at its base raises to approximately 0.5 V. This will deprive Q10 of base drive, thus reducing base drive for Q9, and thereby reducing the collector currents in the output transistors. This self-regulating biasing scheme provides insensitivity to changes in $V_{CC}$, as well as variations in transistor beta. The quiescent current of the output stage is set by R19, and can be set in the range of a few hundred nanoamps to a few microamps for proper operation.

Capacitors C6 and C7 couple the signal from the output of driver stage 14 (i.e., from the collector of Q5) to the bases of Q8 and Q9. The positive excursions of the waveform flow through C6 and increase the base drive to Q8. The resulting emitter current then flows into the load through C8. Current for these positive excursions is provided from the positive supply rail. The handling of the negative-going part of the signal is essentially "free" in that it doesn't require any current from $V_{CC}$. This is because an output coupling capacitor C8 normally has a positive potential applied to it and will provide current for the negative cycle when this normally positive potential is removed and the resulting "stored" charge of the capacitor is provided with a discharge path to ground. Specifically, the emitters of output transistors Q8 and Q9 are biased to 0.6 Volts below $V_{CC}$. On the negative-going part of the cycle, transistor Q8 turns off while Q9 starts to turn on harder. Current starts to flow out of C8 and into the emitter and out the collector of Q9. It continues its path into the base-emitter junction of Q7 to ground. The resulting current is scaled via R15 and mirrored in Q6 which provides a bootstrapped path for base current from Q9 through C7 during the negative half cycles. During these times, Q7 is fully saturated thereby turning off Q10 so as to not disturb the signal path through the base of Q9 and C7.

The maximum theoretical peak-to-peak output signal level is approximately $V_{CC}-(V_{be}+2V_{ce\ sat})$, where $V_{CC}$ is the supply voltage, $V_{be}$ is the base-to-emitter voltage of a transistor, and $V_{ce\ sat}$ is the collector-to-emitter voltage of a transistor in saturation. The base voltage at Q8 is approximately $V_{CC}$, meaning the emitter voltage is one $V_{be}$ below that. The signal is superimposed on this DC level. The maximum positive signal peak at the emitter of Q8 is one $V_{ce\ sat}$ below $V_{CC}$. The maximum negative signal peak is one $V_{be}(Q7)$ plus one $V_{ce\ sat}(Q9)$ above ground. Because the emitter voltage on the output transistors increases as $V_{CC}$ is increased, the theoretical maximum negative going swing can increase as $V_{CC}$ is increased. However, the maximum positive swing is limited by how close to the positive rail Q8's collector/emitter saturation voltage will allow. Therefore, regardless of increases in $V_{CC}$, the maximum usable peak-to-peak voltage is approximately two times the maximum positive peak, or about 900 mV. This output level assumes that the preceding amplifier 12 and driver stage 14 are capable of providing the necessary drive level to the output stage transistors. It is to be understood that although the quiescent current of output stage 16 is very low, actual dynamic current delivered to load impedance 32 can be quite high. The total current that must be supplied is the sum of the quiescent current and the load current. Load current, as stated before, is a function of load impedance and output level, and is expressed as $I_L=V_{out}/2R_L$. It can be seen from this expression that delivering a 300 mV signal into a 150 Ohm load requires a dynamic current from the power source of 1 mA.

Signal expansion is possible by taking advantage of the increase in dynamic emitter resistance of output transistors Q8 and Q9 for low current outputs. Because the emitter current of Q8 and Q9 is a function of the instantaneous signal level, the emitter resistance ($R_e$) of these transistors also changes with signal level. It is known that $R_e$ is approximately 0.025/Ic. This means that the larger $R_e$ at low signal levels would result in a reduction in output level due to the voltage divider effect with the output load impedance. However, because of feedback via C5 and R14 the signal from the driver stage Q4 and Q5 would increase the signal level applied to the bases of the output transistors in an attempt to maintain a constant output. This increased signal is scaled and inverted in phase by R10, R7, and Q3 and "added" to the incoming signal at the input of low-level gain stage 12. This results in a reduction of the actual signal that is "processed" by the entire system, and therefore a further reduction in the output signal level.

Figure 3:
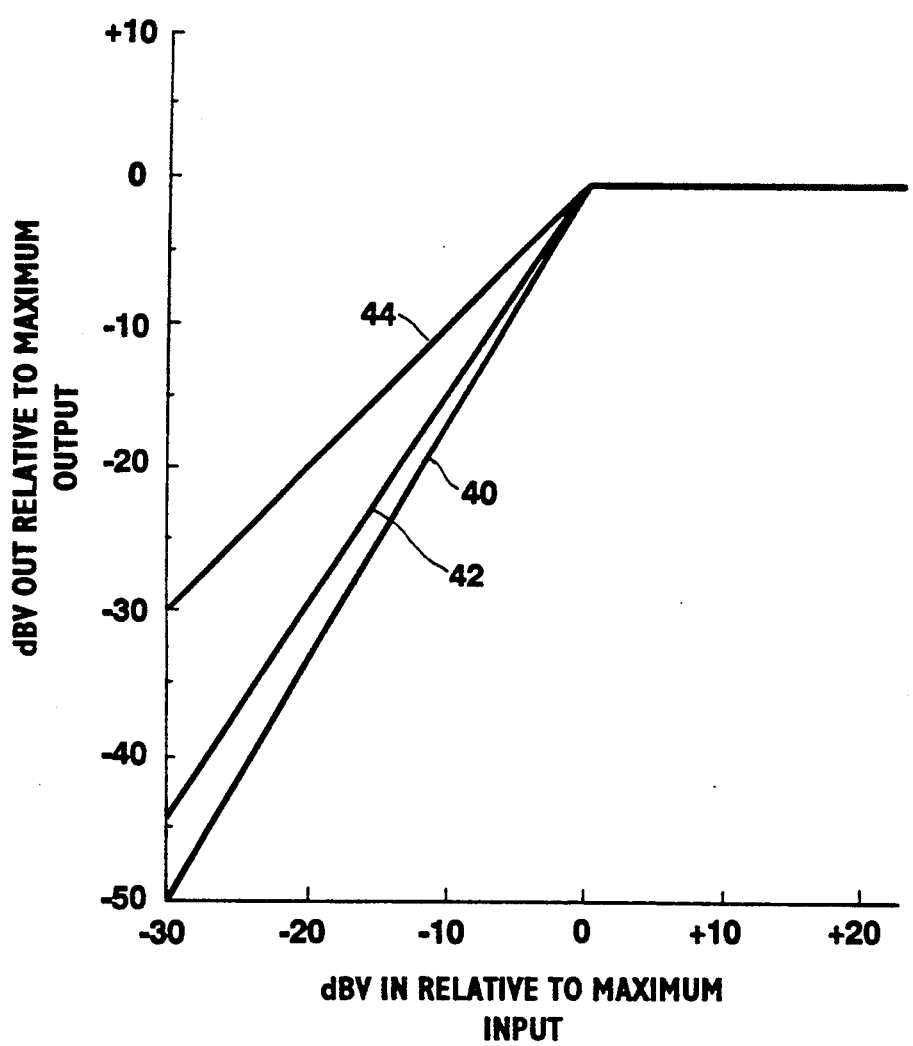
FIG. 3 is a diagram graphically showing the signal expansion characteristics of the system in terms of voltage output verses voltage input for various output load resistances.

The effects of the signal expansion properties of the system in accordance with the present invention are shown graphically in FIG. 3, which is a graph of voltage input (on the abscissa) versus voltage output (on the ordinate) for a system in accordance with the presently disclosed embodiment of the invention with $R_L=150\ \Omega$ (the function designated as 40 in FIG. 3), and for a system in accordance with the presently disclosed embodiment of the invention with $R_L=450\ \Omega$ (the function designated as 42 in FIG. 3).

It is important to note that this action of signal expansion can only take place because of the changes in dynamic emitter resistance. If the output stage was biased into full or even partial conduction, as is typical of Class AB operation, the dynamic voltage divider effect with the output load would not require compensatory changes to the driving signal which supplies the output transistors. Therefore, this signal could not be used to achieve the expansion properties as described.

It will be apparent to one skilled in the art of circuit design that the expansion characteristics of the presently disclosed system are a function of output load impedance 32. The lower the load impedance the greater the effect of the expansion behavior. Adjustment to the input resistor R1 can be used to control the desired expansion slope, while eliminating the feedback signal via the bias control loop by bypassing resistor R7 with a capacitor to ground will completely disable the expansion function. In FIG. 3, the function designated as 44 represents the input-versus-output voltage of a system with the expansion function disabled.

A less obvious side effect of the expansion action is the distortion of the signal which the system is amplifying. This is due to the fact that the compensatory error signal at the collector of Q5 is not only of increased magnitude to compensate for the loading effect of the output transducer, but is also modified in waveshape to compensate for the other nonlinear characteristics of the output stage. This is a natural consequence of the local feedback loop between the output stage and the preceding driver stage. Generally, the distortion byproducts produced are inaudible when the system is used in the amplification of speech signals. In applications where minimum distortion is a requirement, reducing or eliminating the effect of the expansion action by the means mentioned will be necessary.

Typical specifications for the complete system, consisting of all subsystems described herein are as set forth in Table 1 below:

TABLE 1

| | |
|---|---|
| No-signal current: | approx. 25 μA |
| Maximum Vout: | −20 dBV @ Vcc = 1.5 V, −10 dBV @ 2.0 V; $R_L$ = 150 Ω |
| Expansion depth: | 20 dB @ Vin = −60 dBV @ $R_L$ = 150 Ω |
| Minimum $R_L$: | 32 Ω |
| System Gain: | 23 dB @ 1-kHz @ Vout = −10 dBV |

Figure 4:
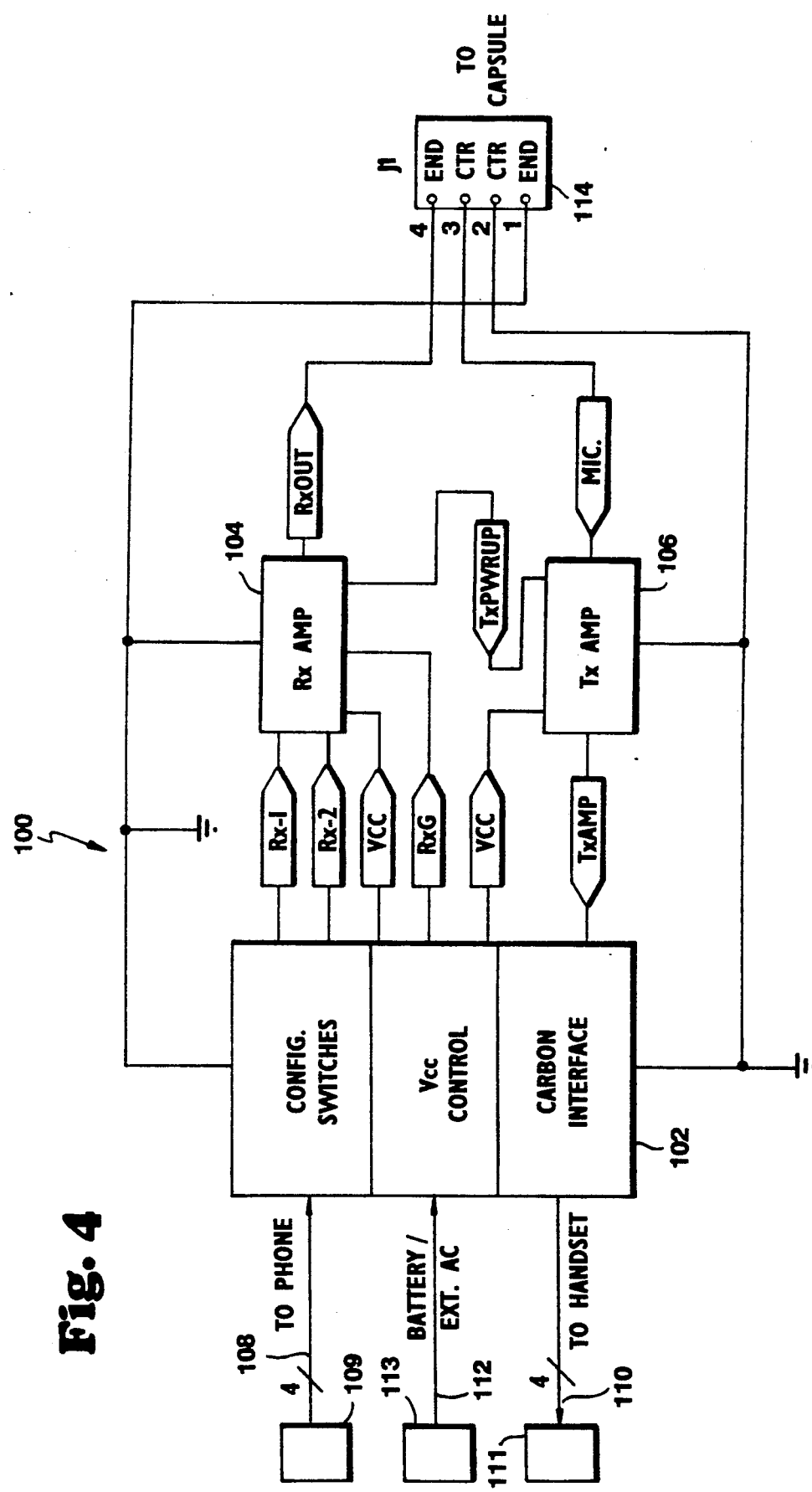
FIG. 4 is a block diagram of a modular telephone headset adapter employing amplifier/driver subsystems in accordance with one embodiment of the present invention.

Turning now to FIG. 4, a block diagram of a modular telephone headset adapter 100 is shown. Modular adapter 100 comprises, inter alia, two amplifiers in accordance with the presently disclosed embodiment of the invention. The modular adapter 100 of FIG. 4 facilitates the connection of a commercially-available telephone headset apparatus (not shown in FIG. 4) to any of various commercially-available telephones (also not shown in FIG. 4). A switching arrangement allows a user to select one of several compatibility modes for modular adapter 100, as shall be hereinafter described.

The switching arrangement is necessary since, as would be apparent to one of ordinary skill in the field of telephony, the electrical and physical configurations of commercially-available telephones can vary from one model to another.

One telephone headset apparatus suitable for the purposes of the present invention is the Mirage ™ manufactured by Plantronics, Inc., Santa Cruz, Calif., although it is to be understood that many commercially-available headsets may also be utilized in practicing the present invention. Another headset apparatus which is suitable for the purposes of the present invention is that of U.S. Pat. No. 4,720,857 issued to Burris et al. and assigned to the assignee of the present invention, which patent is incorporated herein by reference in its entirety.

Modular adapter 100 comprises configuration/control/interface circuitry designated collectively in FIG. 4 as 102, a receive (RX) amplifier 104 and a transmit (TX) amplifier 106. A multiple-conductor line 108 terminates with a modular connector 109, allowing modular adapter 100 to be coupled to the handset port of a conventional telephone base unit (not shown in FIG. 4). Another multiple-conductor line 110 terminating in a modular connector 111 allowing modular adapter 100 to be coupled to a conventional telephone handset (not shown). Circuitry 102 may require connection via connector 113 and line 112 to an external battery or AC power source (not shown). A modular connector 114 permits connection of modular adapter 100 to a telephone headset apparatus, such as that disclosed in the above-referenced '857 patent. It is to be understood that modular connectors 109, 111, and 114 may be any suitable modular-type connectors widely known in the field of telephony, such as conventional RJ 11/14/45 modular connectors or the like. Likewise, connector 113 may be any one of a variety of connector styles which are known and recognized as being suitable for coupling an external power source to modular adapter 100.

When modular adapter 100 is coupled via lines 108 to a telephone base unit and via lines 110 to a handset, it is effectively interposed between the base unit and the handset, thereby enabling the handset and a headset device, coupled at connector 114, to be coupled to the handset port of the telephone base unit.

Figure 5:
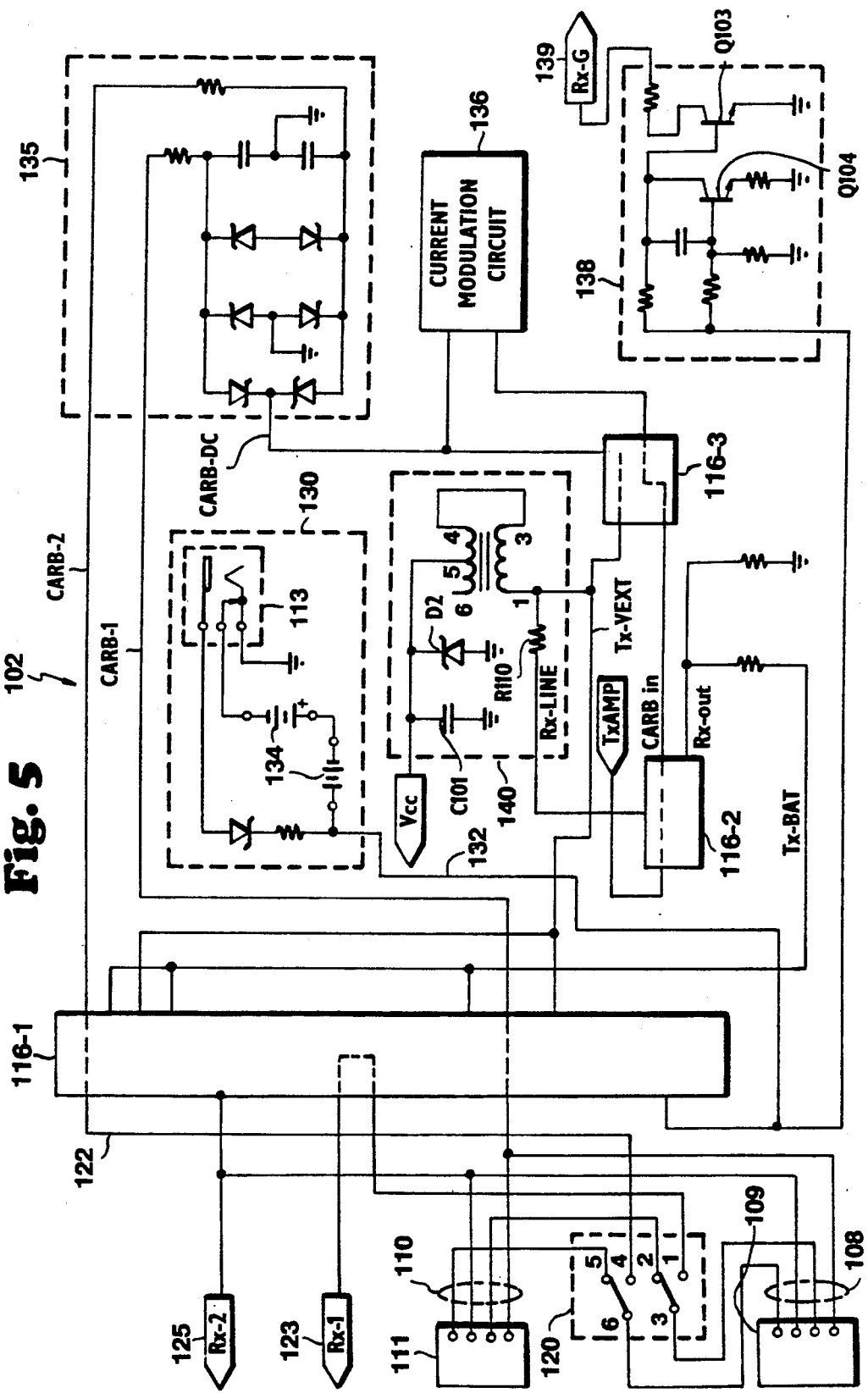
FIG. 5 is a schematic diagram of the configuration/control/interface circuitry from FIG. 4.

Turning now to FIG. 5, a schematic diagram of configuration/control/interface circuitry 102 from FIG. 4 is shown. In FIG. 5, multiple-conductor line 108 discussed previously with reference to FIG. 4 is depicted as four separate conductors terminating with modular connector 109. Similarly, multiple conductor line 110 for coupling circuitry 102 to a telephone handset is depicted in FIG. 5 as four separate conductors terminating with modular connector 111.

A multiple-pole switch 120 in circuitry 102 allows a user of modular adapter 100 to select either handset or headset operation. As would be apparent to one of ordinary skill in the art, switch 120 in the position shown couples a conventional telephone handset (at connector 111) to a conventional phone (at connector 109). In the other position, switch 120 couples a headset capsule (not shown) to the telephone at connector 109.

As previously noted, the electrical and physical configuration of the connections between modular adapter 100 and a telephone base unit and handset can vary from one model of telephone to another. For example, the electrical characteristics of signals associated with a electret-type telephone will be different than those associated with a carbon-type telephone. Furthermore, the physical layout of conductors applied to modular adapter 100 at connection points 109 and 111 may also vary from telephone to telephone. Thus, in order for modular adapter 100 to be capable of operating in conjunction with different types of telephones, a user-actuated switch 116, which is represented in FIG. 5 by blocks 116-1, 116-2, and 116-3, is provided. The switching function implemented by switch 116 allows for the simple reconfiguration of modular adapter 100 to become compatible with a variety of different commercially-available telephones. Switch 116 is preferably implemented in the form of a multiple-pole, sliding contact switch or the like, such that when switch 116 is moved from one position to another, different combinations of connections between the switched conductors are made. It is to be understood that the particular combinations of connections switch 116 must be capable of making will vary depending upon the types of telephones with which modular adapter 100 is to be compatible.

In FIG. 5, a particular one of the multiple combinations of electrical connections made by switch 116 is indicated by dotted lines within the individual blocks 116-1, 116-2, and 116-3. In the position shown, switch 116-1 couples a line 122 originating at switch 120 to the line designated CARB-2, while in other switch positions, switch 116-1 may couple line 122 to the line designated TX-BATT, ground, or TX-VEXT. In the Figures, it is to be understood that the arrow-shaped connector boxes such as those designated 123 and 125 in FIG. 5 are intended to indicate a connection of a particular line to a correspondingly designated line on a different sheet of the drawings. Thus, for example, connector box 123 on the line RX-1 is to be deemed connected to box 123 on the line RX-1 in FIG. 6. The set of connections indicated with dotted lines in FIG. 5 render modular adapter 100 compatible with a carbon-type telephone. If a different compatibility is required, switch 116 may be moved to a different position, thereby establishing a different set of connections between the switched conductors in modular adapter 100.

Each of the positions of switch 116 should preferably correspond to a particular compatibility mode for modular adapter 100. In the presently disclosed embodiment, the connections shown by dotted lines in blocks 116-1, 116-2, and 116-3 corresponds to a "Carbon" setting, in which modular adapter 100 is rendered compatible with telephones having conventional carbon-granule transducers. Another position may render the telephone compatible with certain telephones commercially available from AT&T, such as the Merlin TM System. Other positions may render modular adapter 100 compatible with various other commercially available telephones, such as various "Electronic" telephones manufactured by Panasonic, or so-called "dynamic" telephones where DC power is not supplied to the microphone, such as models manufactured by Siemens or Rolm.

With reference again to FIG. 5, recall that external power for modular adapter 100, if required, is applied to circuitry 102 via connector 113. The portion of circuitry in FIG. 5 designated within dashed line 130 provides a DC power signal on line 132. As would be apparent to one of ordinary skill in the art, the DC power supply on line 132 may be provided either from batteries 134 within modular adapter 100, or from an external AC-to-DC adapter (not shown) coupled at connector 113. When an external adapter is coupled to connector 113, batteries 134 are automatically disconnected from circuitry 102, since they are not required when an external adapter is utilized.

The circuitry designated within dashed line 135 is operable when modular adapter is in "Carbon" mode. Circuitry 135, comprising diodes D3, D4, D5, D6, D7, and D8, capacitors C102 and C103, and resistors R102 and R103, is a full-wave rectifier which is required because carbon-type telephones produce an output voltage that is of unspecified and unpredictable polarity. Circuitry 135 ensures that a positive voltage is provided on the CARB-DC line.

A block 136 in FIG. 5 represents a current modulation circuit which is also operable when modular adapter 100 is in "Carbon" mode and lines CARB-DC and TX-VEXT are connected as shown by the dotted line in switch 116-3. Current modulation circuit 136, is a current modulating stage which modulates the current drawn by modular adapter 100 in response to signals from transmit amplifier 106 on the line TX-VEXT. The transmit amplifier output signal on line TX-VEXT controls the amount of current drawn from the CARB-DC line through rectifier 135.

The circuitry designated within dashed line 138, including resistors R111, R112, R113, R114, and R115, capacitor C104, and NPN transistors Q103 and Q104, is a low-battery-voltage detector. Note that circuitry 138 is coupled to line RX-G, which controls the gain (i.e. the volume) of the receiver amplifier 104, as shall be hereinafter described with reference to FIG. 8. Circuitry 138 causes a reduction in the receiver amplifier gain of about 10 db when the combined voltage of batteries 134 drops below two volts. The external or battery voltage supply is provided on line 132, as previously described, and line 132 is provided to circuit 138. When the battery voltage on line 132 drops below two volts, transistor Q103 is rendered conductive, causing a reduction in receiver gain as shall be hereinafter described.

The circuitry designated within dashed line 140, including diode D2, capacitor C101, resistor R110 and transformer T1 serves to eliminate any AC component of power supplied to modular adapter 100. For example, in the Carbon mode, power is supplied from rectifier circuit 135 as previously discussed, on line CARB-DC; in Carbon mode, CARB-DC is coupled to transformer T1 through the operation of switch 116-3. In Battery or Siemens mode, the battery or external power supplied on line 132 is applied to transformer T1 through the operation of switch 116-1. In L+ or L− modes, DC power is supplied from the line TX-BATT, which is coupled to transformer T1 through operation of switch 116-2.

Figure 6:
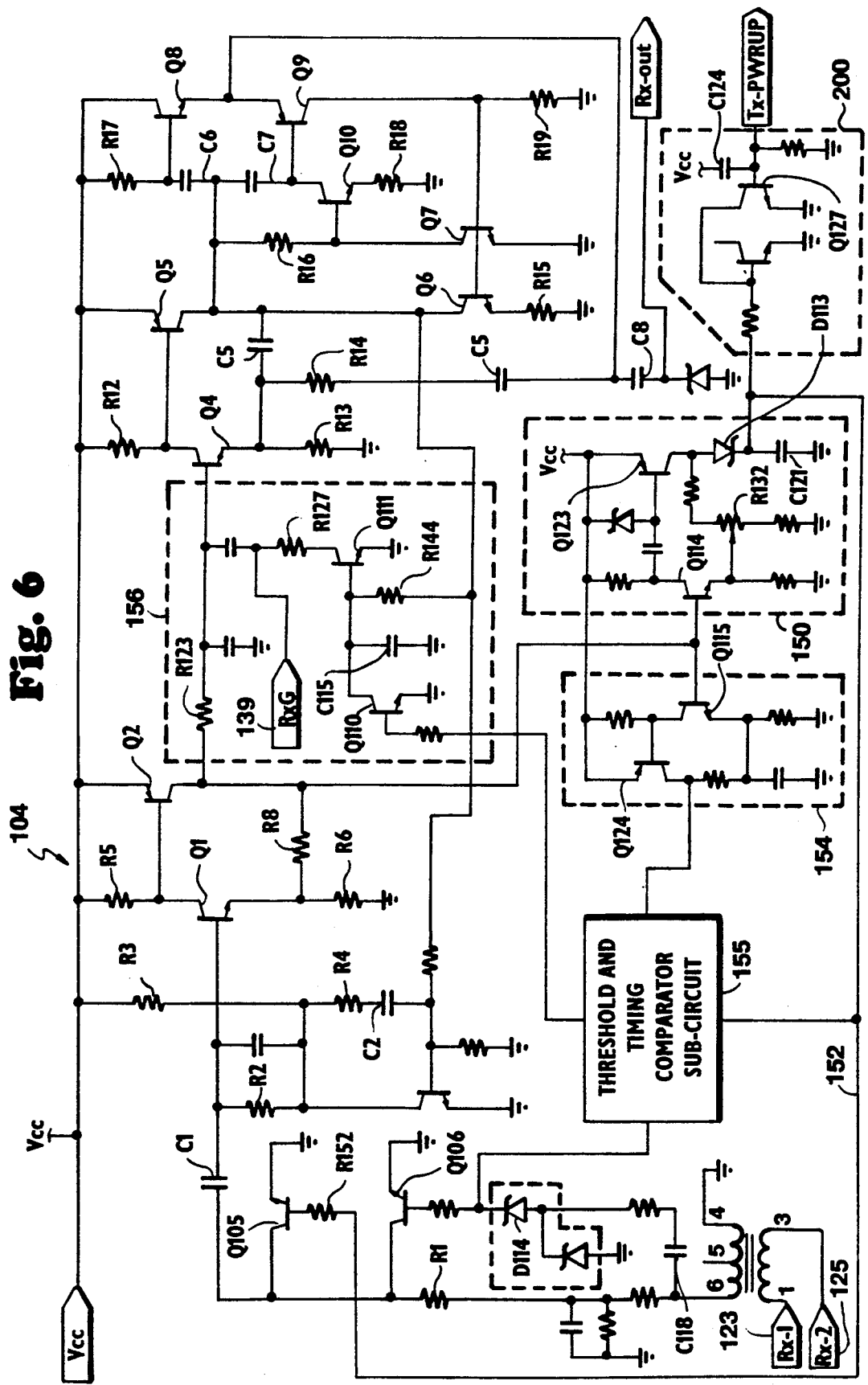
FIG. 6 is a schematic diagram of the receive amplifier from the modular adapter of FIG. 4.

Turning now to FIG. 6, a schematic diagram of receiver amplifier 104 from FIG. 4 is shown. Receiver amp 104 is constructed substantially in accordance with the embodiment of the present invention previously discussed with reference to FIGS. 1, 2, and 3; components of the amplifier of FIG. 6 which are the same as those in the amplifier of FIG. 2 have retained identical reference numerals, and the functional description of those components will not be repeated.

The circuitry designated within dashed line 150 in FIG. 6 is referred to herein as the "High-Level Peak Control Stage" or HLPCS. HLPCS 150 is a gain stage which is controlled by variable potentiometer R132. The receiver signal is provided from transistor Q2, which, as previously noted with reference to FIG. 2 constitutes the output of low-level gain stage 12. The output from Q2 is provided to the base of transistor Q114 in HLPCS 150. Transistor Q114 serves as an amplifier for the output signal from Q2, and amplified negative-going signal peaks at the collector will cause transistor Q123 to turn on. Current flowing through the emitter-collector path of Q123 will flow through diode D113 and will charge capacitor C121. When sufficient charge, for example, approximately one-half of a volt, is accumulated on C121, transistor Q105 is rendered conductive (since the base of transistor Q105 is coupled to capacitor C121 via line 152 and resistor R152. When transistor Q105 is rendered conductive, this has the effect of attenuating the signal provided to input capacitor C1 of receive amplifier 104, and thus, the input signal received at the base of Q1 in low-level gain stage 12 of the amplifier.

HLPCS 150 is a fast-acting gain control stage, since capacitor C121 charges up almost instantly upon the occurrence of a peak applied to the base of Q114. By very quickly attenuating the input of low-level gain stage 12 upon the occurrence of such a peak, HLPCS effectively limits the magnitude of peaks amplified by receiver amplifier 104.

The circuitry within dashed line 154 is part of what will be referred to herein as a "Low-Level Peak Control Stage" or LLPCS, which attenuates the level of sustained tones or other steady, non-speech signals applied to receiver amplifier 104. As with the HLPCS, the LLPCS receives the output of low-level gain stage 12, from the collector of Q2. This is applied to the base of transistor Q115, which together with transistor Q124 serves to amplify the output of low-level gain stage 12. This amplified signal is taken from the collector of Q124, and through the action of a LLPCS Threshold and Timing Comparator Subcircuit 155, controls transistor Q106 in much the same manner as transistor Q105, attenuating the input signal to low-level gain stage 12.

In some instances, the signal level from amplifier 154 may be insufficient to turn on attenuating transistor Q106 hard enough to accomplish the desired level of attenuation. For very large input signals applied to receiver amplifier 104 via RX-1 terminal 123 and RX-2 terminal 125, these signals are converted to a DC signal by the action of C118 and D114 and applied to the base of transistor Q106. In this way, the AC input signal itself (after being converted to DC) contributes to the turning on of attenuator transistor Q106 for very large input signals.

Whereas HLPCS 150 is designed to have an attack time of approximately three milliseconds and a release time of approximately one second, Threshold and Timing Comparator Subcircuit 155 is intended to have a slower attack time of approximately 300-mSec and a release time of approximately seven milliseconds. This is so that the LLPCS can reset itself during the naturally occurring pauses between spoken words and syllables, and will only turn on in response to sounds such as dial tones, DTMF dialing tones, test tones, and the like, which would be uncomfortable or harmful to the user of a headset if they were allowed to be fully amplified.

With continued reference to FIG. 6, the circuitry within dashed line 156 is a noise reduction circuit, which attenuates the receiver output signal by about 6 db when the receiver amplifier has no input signal. In this way, the amplification of noise and low-level static is attenuated in the absence of the other receiver inputs. Normally, transistor Q111 is turned on due to power supplied to the base of Q111 via resistor R144. Due to the voltage divider formed by resistors R123 and R127, the signal level applied to the base of transistor Q4 is attenuated when transistor Q111 is turned on. A signal is applied to the base of transistor Q110 from Threshold and Timing Comparator Subcircuit 155, thus controlling the conduction of Q110 as a function of signal conditions. When Q110 turns on, capacitor C115 will discharge, turning Q111 off. When Q111 turns off, the receiver amplifier is at full gain. However, when there is no incoming signal on lines RX-1 and RX-2, Q110 will be off, allowing capacitor C115 to charge through R144. The charging of capacitor C115 takes approximately two hundred milliseconds; as C115 is charged, transistor Q111 turns on, thereby attenuating the signal applied to the base of Q4.

Recall from FIG. 5 that low-battery detection circuitry 138 is coupled to RX-G terminal 139, which is also shown within AGC circuit 156 in FIG. 6. As previously discussed, when battery power on line 132 drops below approximately two volts, transistor Q103 in circuit 138 is rendered conductive, establishing a path from RX-G terminal 139 to ground. As can be seen in FIG. 6, when the path from RX-G terminal 139 to ground is established, the signal applied to the base of transistor Q4 is attenuated. In this way, the user is alerted when the battery power becomes insufficient through a reduction in receiver volume.

With continued reference to FIG. 6, the circuitry designated collectively within dashed line 200 functions to limit the voltage on line 152 to approximately 0.7volts, so that HLPCS 150 allows the system gain to return to a maximum level more quickly. Transistor Q127, by virtue of the connection of its base to $V_{CC}$ with capacitor C124, turns on momentarily when $V_{CC}$ power is first applied to the modular adapter. When power is first applied, current in capacitor C124 renders transistor Q127 conductive, and line 152 is effectively coupled to ground. This prevents the receiver gain from being reduced upon power-up. Once $V_{CC}$ power has stabilized, Q127 turns off, and operation of HLPCS 150 occurs as described above. The connection terminal labeled TXPWRUP in FIG. 6 indicates a connection to a similarly labeled terminal TXPWRUP to be hereinafter described with reference to FIG. 7.

Figure 7:
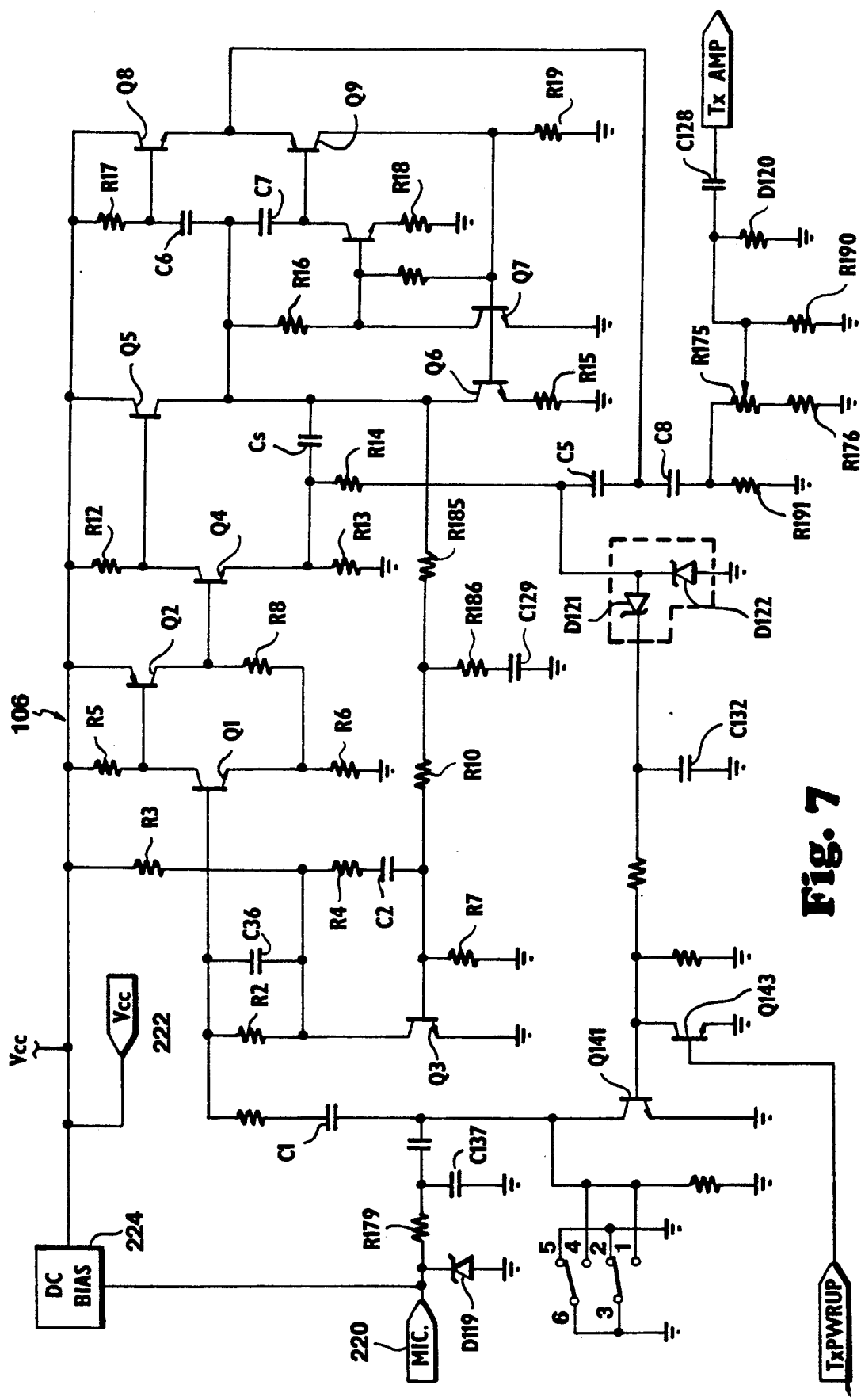
FIG. 7 is a schematic diagram of the transmit amplifier from the modular adapter of FIG. 4.

Turning now to FIG. 7, terminal connector TXPWRUP is coupled to the base of a transistor Q143, which transistor is thereby rendered conductive momentarily upon application of power to $V_{CC}$. When Q143 is rendered conductive, capacitor C132 is effectively grounded, so that transmit gain is not reduced during power-up.

It is to be understood that transmit amplifier 106 shown in FIG. 7 incorporates an amplifier in accordance with the embodiment of the invention disclosed with reference to FIG. 2, and that components of transmit amplifier 106 in FIG. 7 which are identical to components in the amplifier of FIG. 2 have retained identical reference numerals. It is believed by the inventor to be unnecessary to repeat the description of operation of components of transmit amplifier 106 which are identical to components already described with reference to FIG. 2.

As shown in FIG. 7, the output signal from the emitter terminals of transistors Q8 and Q9 is applied to capacitors C5 and C8, as previously discussed with reference to FIG. 2. Variable resistor R175 is a user-actuated potentiometer which controls the transmitted signal level, with resistors R175 and R176 forming a simple voltage divider. Resistor R190 linearizes the characteristics of potentiometer R175, so that gain control may be more evenly scaled along the full range of potentiometer R175. Coupling capacitor C128 prevents passage of DC signals at the transmitter amplifier output to ground. Zener diode D120 protects the output stage from damage from electrostatic discharge.

When the output signal from transmitter amplifier 106 increases, diodes D121 and D122 allow the output signal to charge capacitor C132. When enough charge has accumulated on capacitor C132, transistor Q141 will turn on, attenuating the input signal to transmitter amplifier 106 applied via MIC terminal 220. Resistor R179 and transistor Q141 thus perform a signal compression function on the transmitter output signal.

With continued reference to FIG. 7, zener diode D119 prevents transient voltage spikes from damaging amplifier 106. Capacitor C137 provides for a high-frequency roll-off, for the purposes of suppressing radio frequency interference and the like. Resistors R185 and R186 and capacitor C129 limit feedback from the secondary driver stage 14 and thereby provide a high-frequency boost to the amplifier output signal.

As shown in FIG. 7, DC power is supplied to transmit amplifier 106 at Vcc terminal 222. A DC bias circuit 224, which may be implemented in various ways as would be known to a person of ordinary skill in the art of circuit design, provides a constant 100-μA power source to MIC terminal 220. This 100-μA signal is utilized by a microphone, not shown, as would be apparent to one of ordinary skill in the art. DC bias circuit 224 preferably has a very low saturation voltage and should be relatively insensitive to fluctuations in $V_{CC}$.

From the foregoing description of a particular embodiment of the present invention, it should be apparent that a modular telephone adapter employing an amplifier/transducer driver design has been disclosed, wherein the receiver and transmitter amplifiers of the modular adapter draw a minimal amount of current and introduce a minimal amount of distortion into the amplified signal. That is, the disclosed receiver and transmitter amplifiers combine the low power consumption qualities of a Class B amplifier with the minimal distortion qualities of a Class AB amplifier.

Although particular embodiments of the present invention have been described in detail, it is to be understood that various alterations, substitutions or modifications may be made therein without departing from the spirit and scope of the invention as set forth in the following claims.

What is claimed is:

1. A dynamic bias, low quiescent-current amplifier for producing an amplified output signal corresponding to a raw input signal and applying said amplified output signal to a load impedance, comprising:

an input amplifier stage drawing an input stage quiescent current, said input stage having inverting and non-inverting input stage inputs and having an input stage output, said input stage output presenting an input stage output signal;

a driver amplifier stage drawing a driver stage quiescent current, said driver stage having inverting and non-inverting driver stage inputs and having a driver stage output presenting a driver stage output signal, said driver stage non-inverting input being coupled to said input stage output to receive said input stage output signal;

an output amplifier stage comprising first and second transistors having first and second emitter terminals, respectively, coupled in a push-pull arrangement, said output amplifier stage drawing an output stage quiescent current, said output stage having an output stage input and an output stage output presenting an output stage output signal, said output stage being coupled to said load impedance, and said output stage input being coupled to said driver stage output;

a DC power supply for providing a variable DC power signal to said input, driver, and output stages;

a dynamic bias control circuit, coupled to said output stage and adapted to dynamically monitor and control said output stage quiescent current;

a feedback compensation circuit, coupled between said output stage output and said inverting driver stage input, said feedback compensation circuit responsive to variations in resistance of said first and second emitter terminals to produce a compensatory signal at said inverting driver stage input;

a combination AC and DC feedback circuit, coupled to said driver stage output to receive said driver stage output signal, said AC and DC feedback circuit also coupled to said DC power supply and responsive to said driver stage quiescent current to control said variable DC power signal;

a phase inversion circuit, coupled to said AC and DC feedback circuit and adapted to produce a phase-inverted signal proportional to said driver stage output signal;

a voltage summing circuit, coupled to said phase inversion circuit and to said non-inverting input stage input, and responsive to said phase-inverted signal to attenuate said raw input signal and apply said attenuated raw input signal to said non-inverting input stage input.

2. A dynamic bias, low quiescent-current amplifier for delivering an amplified output signal through a load impedance, comprising an input amplifier stage, a driver amplifier stage, and a current-amplifying output stage, said output stage comprising:

a first transistor having first collector, base, and emitter terminals, said first collector terminal coupled to a DC power supply, said first base terminal connected to said DC power supply via a first bias resistor and receiving a driver signal via a first capacitor;

a second transistor having second collector, base, and emitter terminals, said second emitter terminal coupled to said first emitter terminal, said second base terminal receiving a driver signal via a second capacitor, and said second collector terminal coupled to ground via a second bias resistor;

an output capacitor having a first terminal coupled to said first and second emitter terminals and having a second terminal coupled to said load impedance;

a third transistor having third collector, base, and emitter terminals, said third base terminal coupled to said second collector terminal, said third collector terminal receiving said driver signal with DC bias via a third bias resistor, and said third emitter terminal coupled to ground;

a fourth transistor having fourth collector, base, and emitter terminals, said fourth base terminal coupled to said second collector terminal, said fourth emitter terminal coupled to ground via a first emitter resistor, said fourth collector terminal receiving said driver signal;

a fifth transistor having fifth collector, base, and emitter terminals, said fifth collector terminal coupled to said second base terminal, said fifth emitter terminal coupled to ground via a second emitter resistor, and said fifth base terminal coupled to said third collector terminal;

wherein a positive excursion of said driver signal turns on said first transistor such that current flows from said power supply, into said first collector terminal, out of said first emitter terminal, through said output capacitor and through said load impedance;

and wherein a negative excursion of said driver signal draws current out of said second base terminal and turns on said second transistor such that current provided from charge stored in said output capacitor during said positive excursion flows into said second emitter terminal, out of said second collector terminal, and into said third and fourth base terminals, thereby turning on said third and fourth transistors;

and wherein said fourth transistor, when turned on, establishes a partial path for said current drawn from said second base terminal, through said second capacitor, into said fourth collector, out of said fourth emitter, and through said first emitter resistor to ground;

and wherein said third transistor provides a path for current from said second collector into said third base, and out said third emitter to ground;

and wherein when said third transistor turns on, base drive to said fifth transistor is reduced;

and wherein quiescent collector current of said second transistor which flows into said second bias resistor controls said third transistor, thereby controlling base drive to said fifth transistor and establishing a quiescent current level in said output stage.

3. An amplifier in accordance with claim 2, wherein said input stage comprises an input stage input and an input stage output, said input stage input coupled to a source of a raw input signal, and said driver stage comprises a driver stage input coupled to said input stage output, and a driver stage output coupled to said output stage, and wherein said amplifier further comprises:

a combination AC and DC feedback path coupling said driver amplifier output to said input stage input;

a bias control and signal inversion stage, disposed along said feedback path, responsive to a quiescent current in said driver stage to produce a DC control voltage for controlling quiescent current in said input stage and said driver stage, said bias control and signal inversion stage also responsive to said amplified output signal to attenuate said raw input signal;

a second feedback path coupling said output capacitor to said driver stage input;

a series-connected resistor and capacitor combination disposed along said second feedback path, responsive to variations in emitter resistance in said first and second transistors to produce a compensatory signal;

said compensatory signal being applied to said bias control and signal inversion stage.

4. A dynamic bias, low quiescent-current amplifier for delivering an amplified signal through a load impedance, comprising an input stage, a driver stage and an output stage, said output stage comprising:

a first transistor having first collector, base, and emitter terminals, said first collector terminal coupled to a positive power supply, said first base terminal receiving a driver signal via a first capacitor;

a second transistor having second collector, base and emitter terminals, said second emitter terminal coupled to said first emitter terminal, said second base terminal receiving said driver signal via a second capacitor;

an output capacitor, having a first terminal coupled to said first and second emitter terminals and having a second terminal coupled to said load impedance;

wherein a positive excursion of said driver signal turns on said first transistor such that current flows from said power supply, into said first collector terminal, out of said first emitter terminal, across said output capacitor and through said load impedance, a charge thereby being stored in said output capacitor;

and wherein a negative excursion of said driver signal turns on said second transistor such that current provided from said charge stored in said output capacitor flows into said second emitter terminal, out of said second collector terminal, and into third and fourth base terminals, respectively, of third and fourth transistors, thereby turning on said third and fourth transistors;

and wherein said third transistor base-emitter junction establishes a path for current from said output capacitor during said negative excursion of said driver signal;

and wherein said fourth transistor, when turned on, establishes a path for current from said second base, through said second capacitor, and through said fourth transistor to ground via an emitter resistor.

5. An amplifier in accordance with claim 4, wherein:

said input stage comprises a first input and a first output, said first input receiving a raw input signal input, said input stage producing an input stage output signal at said first output;

said driver amplifier stage comprises a second input and a second output, said second input being coupled to said first output and said second output coupled to an input of said output stage, said driver amplifier amplifying said first stage output signal to produce said driver signal at said second output;

a feedback path coupling said first emitter terminal, said second emitter terminal and said output capacitor to said second output, such that a decrease in said signal at said first and second emitter terminals produces a compensatory signal increase at said second output;

and a second, phase-inverting feedback path coupling said second output to said first input, such that said compensatory signal increase at said second output reduces said input signal.

* * * * *